United States Patent
Aggarwal et al.

(10) Patent No.: US 9,268,715 B2
(45) Date of Patent: Feb. 23, 2016

(54) SYSTEM AND METHOD FOR VALIDATION OF CACHE MEMORY LOCKING (71) Applicants: Puneet Aggarwal, New Delhi (IN); Eswaran Subramaniam, Kattuputhur (IN)

(72) Inventors: Puneet Aggarwal, New Delhi (IN); Eswaran Subramaniam, Kattuputhur (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 257 days.

(21) Appl. No.: 14/188,650

(22) Filed: Feb. 24, 2014

(65) Prior Publication Data

US 2015/0242337 A1    Aug. 27, 2015

(51) Int. Cl.
*G06F 12/14*    (2006.01)
(52) U.S. Cl.
CPC ...... *G06F 12/1483* (2013.01); *G06F 2212/507* (2013.01)
(58) Field of Classification Search
None
See application file for complete search history.

(56) References Cited

U.S. PATENT DOCUMENTS

| | | | |
|---|---|---|---|
| 5,493,667 A | 2/1996 | Huck | |
| 5,822,764 A | 10/1998 | Hardage | |
| 6,282,637 B1 * | 8/2001 | Chan | G06F 9/30021 710/200 |
| 7,386,434 B1 * | 6/2008 | Cischke | G01R 31/318357 703/14 |
| 7,827,360 B2 * | 11/2010 | Rahman | G06F 12/0846 711/141 |
| 2002/0046334 A1 * | 4/2002 | Wah Chan | G06F 9/30021 712/223 |
| 2012/0268458 A1 | 10/2012 | Gao | |
| 2012/0311248 A1 | 12/2012 | Goodman | |
| 2012/0311380 A1 | 12/2012 | Moyer | |

OTHER PUBLICATIONS

Charles Lin, "Set Associative Cache", Dec. 3, 2005, pp. 1-2, https://web.archive.org/web/20051203182636/http://www.cs.umd.edu/class/sum2003/cmsc311/Notes/Memory/set.html.*
Microsoft, "DNS Cache Locking", Oct. 21, 2009, pp. 1-2, https://technet.microsoft.com/en-us/library/ee683892(v=ws.10).aspx.*

* cited by examiner

*Primary Examiner* — Edward Dudek, Jr.
*Assistant Examiner* — Christopher D Birkhimer
(74) *Attorney, Agent, or Firm* — Charles E. Bergere (57) ABSTRACT

A cache lock validation apparatus for a cache having sets of cache lines and coupled to a cache controller. The apparatus includes a memory coupled to a processor. The memory includes test case data related to an architecture of the cache. The processor selects a first set of the sets of cache lines and generates a corresponding first group of addresses and an overflow status address. The processor instructs the cache controller to sequentially lock the first group of addresses and the overflow status address. The processor checks a status of an overflow bit in a status register of the cache controller upon locking the overflow status address, and generates a FAIL status signal when the overflow bit is reset.

20 Claims, 6 Drawing Sheets

SYSTEM AND METHOD FOR VALIDATION OF CACHE MEMORY LOCKING

BACKGROUND OF THE INVENTION

The present invention relates generally to cache memories, and, more particularly, to validation of locking and unlocking of a cache memory.

A cache memory is a type of memory in a processing system for temporarily storing data or instructions that are likely to be used again. In many modern processing systems, the cache memory is classified into different levels of hierarchy based on its size and the latency period for fetching requested data, such as L1 (level 1), L2, L3, etc. The processing system starts searching for the requested data or instruction in the first level cache (L1) onwards. As the level of hierarchy increases, the time required for fetching the requested data or instruction also increases, thereby increasing the latency.

Typically, the requested data or instruction is stored in cache lines of the cache memory. Each cache line maps to a particular block of addresses in the memory of the main processing system. Since the number of cache lines is less than the number of blocks of addresses, there are a few methods for mapping different blocks of addresses to the cache lines, such as direct mapping, associative mapping, and set-associative mapping. In direct mapping, each block of addresses of the main processing system memory maps to only one cache line in the cache memory. In associative mapping, a block of addresses from the main processing system memory can map to any cache line of the cache memory. In set-associative mapping, the cache memory is divided into sets of cache lines, with each set having a fixed number of cache lines. A block of addresses from the main processing system memory can map to any cache line in a given set determined by that block's address. Once a block of addresses is successfully mapped to a cache line, the processing system can easily fetch the data or instruction from the cache memory.

Sometimes it is possible for the data or instruction stored in the cache memory to be overwritten in duration of time-to-live (TTL) interval. To avoid such errors, cache locking is enabled, which ensures protection against erroneous handling of the cache memory. A cache hit within a locked cache memory is served in a similar manner as that served by an unlocked cache memory, whereas a cache miss in the locked cache memory is considered as a cache-inhibited access. The cache memory can be completely locked or partially locked ('way locking') when the data or instruction size is small as compared to the size of the cache memory. In way locking, only a portion of the cache memory is locked by locking ways of a determined set of the cache memory.

Figure 1:
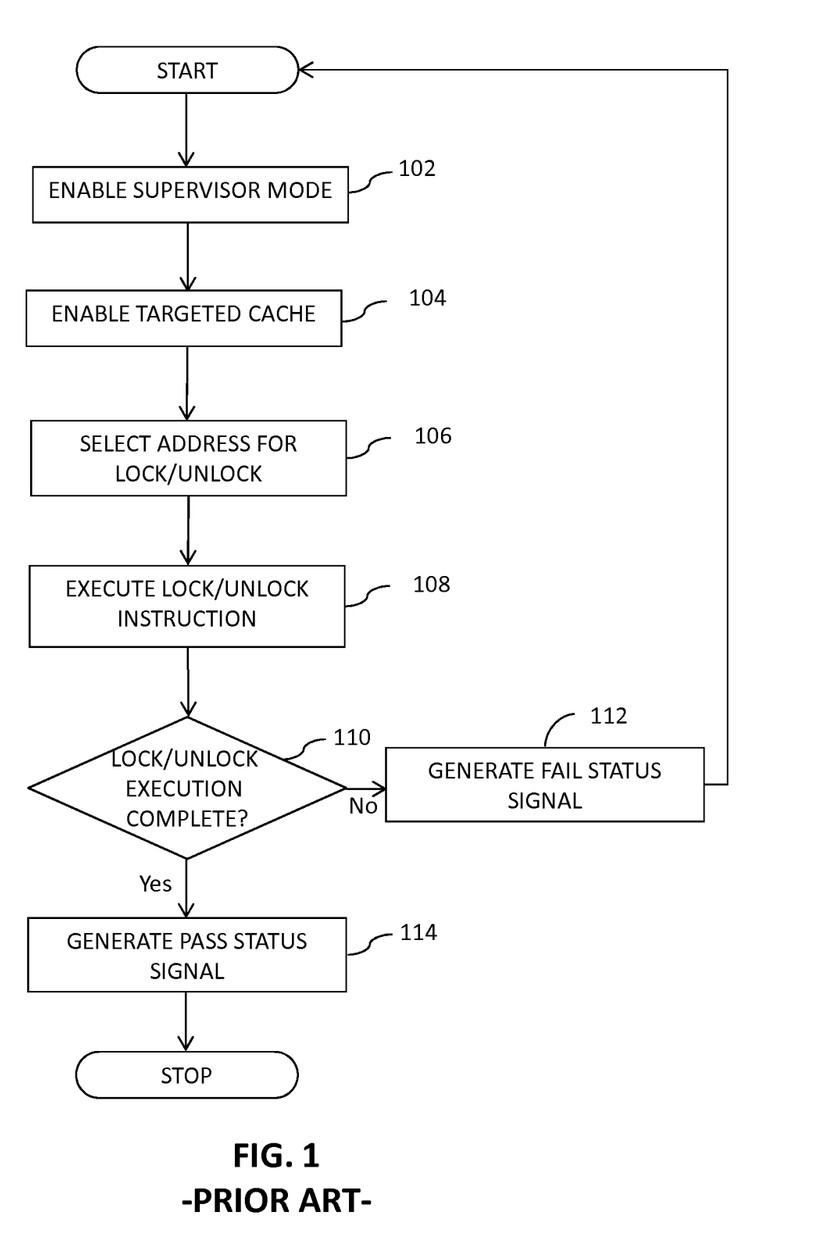
FIG. 1 is a flow chart illustrating a conventional method for validating locking and unlocking features of a cache memory.

Since cache locking is an important feature, there is a need to validate this feature on a chip during post-silicon validation. There are different ways to validate the cache locking feature. FIG. 1 is a flow chart illustrating a conventional method for validating the cache locking and unlocking features. At step 102, a processor that is in communication with the cache memory is set to operate in a supervisor mode. At step 104, the targeted cache memory is enabled. At step 106, addresses corresponding to cache lines of the targeted cache memory are selected for validating the locking and unlocking features. At step 108, the locking and unlocking of each selected address is executed. At step 110, a check is performed to determine if locking and unlocking of each selected address was successful. If the locking and unlocking of each selected address was not successful, at step 112, a FAIL status signal is generated. Thereafter, steps 102-108 are repeated. On the other hand, if the locking and unlocking of each selected address is completed, at step 114, the locking and unlocking feature of the cache memory is validated and a PASS status signal is generated.

However, the above-mentioned method for validating the locking and unlocking features has several drawbacks. It validates the correctness of the locking feature for only a fixed number of selected addresses, and does not randomly validate the locking and unlocking feature by performing back to back locking and unlocking of the cache lines. Another feature of the cache memory, referred to as the 'lock-flash clear' feature, in which all the selected addresses are unlocked simultaneously, cannot be validated by this method. Also, this method does not extend to the different hierarchies of the cache memories, such as L1, L2, and L3.

Therefore, it would be advantageous to have a system and method for validating the locking and unlocking features of the cache memory that randomly selects the addresses based on the cache memory configuration and performs back-to-back locking and unlocking operations on the selected addresses, that can be implemented for all levels of cache hierarchy, that additionally validates the lock-flash clear feature, and that generally overcomes the above-mentioned problems of the existing method for validating the locking and unlocking features of a cache memory.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for validating at least one feature of a cache memory of a system-on-chip (SoC) using a validation apparatus, is provided. The SoC includes a cache controller in communication with the cache memory. The cache memory includes a plurality of sets of cache lines. The validation apparatus includes a memory and a processor in communication with the memory. The memory stores test case data corresponding to architecture of the cache memory. The processor selects a first set of cache lines of the plurality of sets of cache lines based on the test case data. The processor generates a first group of test addresses corresponding to the first set of cache lines and an overflow status test address corresponding to an overflow status cache line. The processor instructs the cache controller to simultaneously unlock a first group of addresses and an overflow status address in the cache memory. The first group of addresses corresponds to the first group of test addresses and the overflow status address corresponds to the overflow status test address. The processor saves the first group of test addresses and the overflow status test address in to a first list. The first list is stored in the memory. The processor instructs the cache controller to sequentially lock the first group of addresses and the overflow status address. The cache controller should set an overflow bit in a status register thereof on locking the overflow status address. The processor sequentially transfers the first group of test addresses and the overflow status test address in to a second list. The second list is stored in the memory. The processor generates a validation signal based on a status of the overflow bit for validating a locking feature of the cache memory.

Various embodiments of the present invention provide a system and method for validating at least one feature of a cache memory of a system-on-chip (SoC) using a validation apparatus. The SoC includes a cache memory and a cache controller in communication with the cache memory. The cache memory includes a plurality of sets of cache lines. The validation apparatus includes a memory and a processor in communication with the memory. The memory stores test case data corresponding to the cache memory architecture. The processor instructs the cache controller to select a type of cache memory among L1, L2, and L3 caches for validation. The processor further instructs the cache controller to identify a data or an instruction attribute of the selected cache memory. Based on the selected cache memory and the test case data, the processor selects a first set of cache lines and creates first and second lists in the memory. The processor generates a first group of test addresses corresponding to the first set of cache lines and an overflow status test address. The processor instructs the cache controller to simultaneously unlock a first group of addresses and an overflow status address in the cache memory, corresponding to the first group of test addresses and the overflow status test address, respectively. The processor simultaneously saves the first group of test addresses and the overflow status test address in the first list. The processor instructs the cache controller to sequentially lock the first group of addresses and the overflow status address and transfers each locked address of the first group of test addresses to the second list. When the first list is empty, the processor checks a status of an overflow bit in a status register of the cache controller. The processor generates a FAIL status signal when the overflow bit is reset, indicating a failure of a locking feature of the cache memory. When the locking feature is operating normally, the overflow bit should be set upon locking the overflow status address. The processor also validates an unlocking feature of the cache memory by unlocking a locked address corresponding to a locked test address in the second list. When the first group of addresses is locked, the processor instructs the cache controller to lock-flash clear the first group of addresses. The processor repeatedly validates the locking, unlocking, and lock-flash clear features of the cache memory for a number of times which is a function of a total number of cache lines in the first set of cache lines. Thus, as opposed to conventional systems, the system of the present invention randomly selects the first set of cache lines from any level of cache hierarchy and performs back-to-back validation of the locking and unlocking features. The system further validates the lock-flash clear feature of the cache memory every time after validating the locking feature.

In the claims, certain features of the invention are defined as "means for" performing an operation. As will be understood by those of skill in the art, a processor, such as a core processor of a SOC, is capable of comprising each of the means when it is in a particular state as determined by the software (and/or firmware) executing on the core. While special hardware elements could be designed for each of the means recited in the claims, unless specifically stated, the means in the claims correspond to various operational states of a core processor of a SOC.

Figure 2:
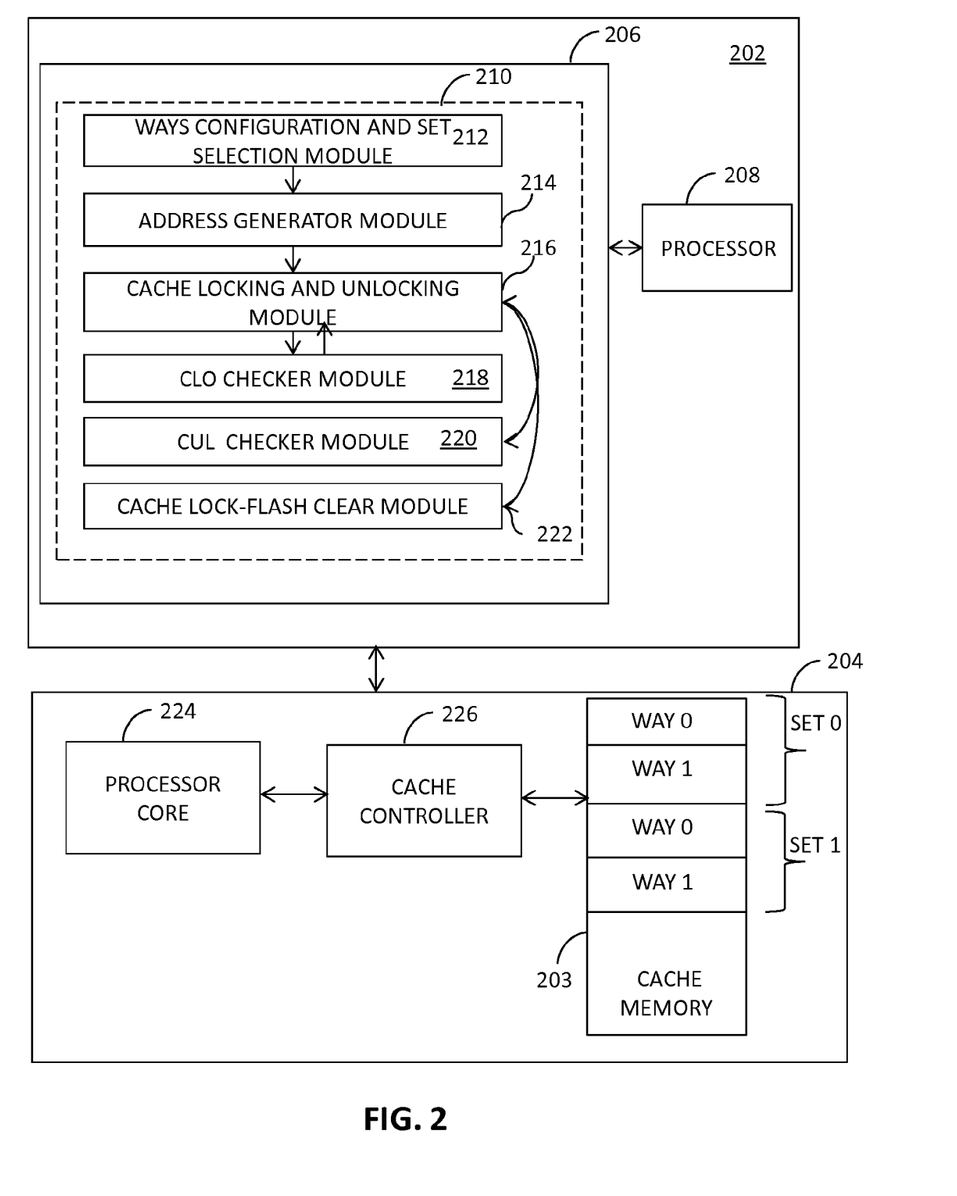
FIG. 2 is a schematic block diagram of an apparatus for validating at least one feature of a cache memory in accordance with an embodiment of the present invention.

Referring now to FIG. 2, a schematic block diagram of an apparatus 202 for validating at least one feature of a cache memory 203 in accordance with an embodiment of the present invention is shown. The validation apparatus 202 may be connected to or a part of another integrated circuit, such as a system-on-chip (SoC) 204. The validation apparatus 202 includes a memory 206 and a processor 208 in communication with the memory 206.

The memory 206 includes a test case generator 210. The test case generator 210 includes a ways configuration and set selection module 212, an address generator module 214, a cache locking and unlocking module 216, a cache-lock-overflow (CLO) checker module 218, a cache-unable-to-lock (CUL) checker module 220, and a cache lock-flash clear module 222. The SoC 204 includes a processor core 224, a cache controller 226, and the cache memory 203. The processor core 224 is in communication with the cache controller 226 and the cache controller 226 is in communication with the cache memory 203.

During post-silicon validation of the SoC 204, locking and unlocking features of the cache memory 203 are validated among other features. The processor core 224 is set into a supervisor mode of operation for the validation. The test case generator 210 that performs the validation on the SoC 204 stores test case data corresponding to architecture of the cache memory 203. The processor 208 instructs the cache controller 226 to enable the cache memory 203 and determine a type of the cache memory 203, i.e., L1 cache, L2 cache, and L3 cache that is to be selected for the validation. The cache controller 226 further determines if the selected type of cache memory 203 is a data cache or an instruction cache. Based on the test case data and the selected type of cache memory 203, the processor 208 determines all the set bits available in the cache controller 226. Each arrangement of the set bits represents a particular set of cache lines in the cache memory 226. For example, set bits represented by the arrangement 001 correspond to a first set of cache lines, 010 corresponds to a second set of cache lines, and so on. The arrangement of the set bits is randomized by the processor 208 to select the first set of cache lines. The processor 208 then configures a number of ways for the first set of cache lines, which corresponds to a fixed number of cache lines in the first set of cache lines. For example, the first set of cache lines may include eight cache lines, i.e., the first set of cache line is configured to have eight ways.

The processor 208 fetches an instruction from the address generator module 214 to generate a first group of test addresses corresponding to the first set of cache lines and an overflow status test address corresponding to an overflow status cache line. The overflow status cache line is selected in addition to the fixed number of cache lines of the first set of cache lines. The processor 208 sets an access attribute of the first group of test addresses and the overflow status test address as 'cacheable'. The processor 208 creates first and second lists in the memory 206. The first list stores all the test addresses of the first group of test addresses that are required to be locked and the second list stores all the test addresses of the first group of test addresses that are actually locked.

The processor 208 executes a 'lock-flash clear' instruction from the cache lock-flash clear module 222 by instructing the cache controller 226 to simultaneously unlock a first group of addresses and an overflow status address that are address locations in the cache memory 203. The first group of addresses corresponds to the first group of test addresses and the overflow status address corresponds to the overflow status test address. The processor 208 saves the unlocked first group of test addresses and the overflow status test address in to the first list in an unordered way.

For validating the locking feature of the selected type of cache memory 203, the processor 208 executes a cache locking instruction from the cache locking and unlocking module 216 by instructing the cache controller 226 to lock each address of the first group of addresses and the overflow status address in a sequential manner. Meanwhile, the processor 208 simultaneously transfers each locked test address of the first group of test addresses and the overflow status test address into the second list. The processor 208 fetches an instruction from the CUL checker module 220 to determine a status of a CUL bit in a status register of the cache controller 226. When the processor 208 determines that the CUL bit is set, it generates a FAIL status signal indicating failure of the locking feature.

Whenever all addresses corresponding to a particular set of cache lines are locked and the cache controller 226 locks an additional address, an overflow bit in the status register of the cache controller 226 sets to one, indicating that the selected set of cache lines is locked. Similarly, once the first list is empty indicating locking of the overflow status address, the processor 208 fetches instruction from the CLO checker module 218 to determine a status of the overflow bit. The processor 208 generates a PASS status signal when the overflow bit is set and a FAIL status signal when the overflow bit is reset. The PASS status signal appropriates the locking feature. When the locking feature is validated, the processor 208 instructs the cache controller 226 to lock-flash clear the first group of addresses, i.e., to simultaneously unlock all addresses of the first group of addresses.

The unlocking feature is validated when at least one address of the first group of addresses is locked. The processor 208 executes a cache unlocking instruction from the cache locking and unlocking module 216 by instructing the cache controller 226 to unlock a locked address corresponding to a locked test address in the second list. The processor 208 then transfers the unlocked test address to the first list.

The processor 208 continues to validate the locking and unlocking features for a random number of times that is a function of the fixed number of cache lines of the first set of cache lines. For example, the processor 208 selects a number 5 randomly between 1 and 10, multiplies the number with the fixed number of cache lines of the first set of cache lines, i.e., 8, and validates the locking, unlocking and lock-flash clear features of the cache memory 40 times. For every cycle of validation, the processor 208 randomly selects a set of cache lines across the cache memory 203 hierarchy, such as L1 cache, L2 cache, and L3 cache, thereby validating every possible combination of sets and types of the cache memory 203.

Figure 3A:
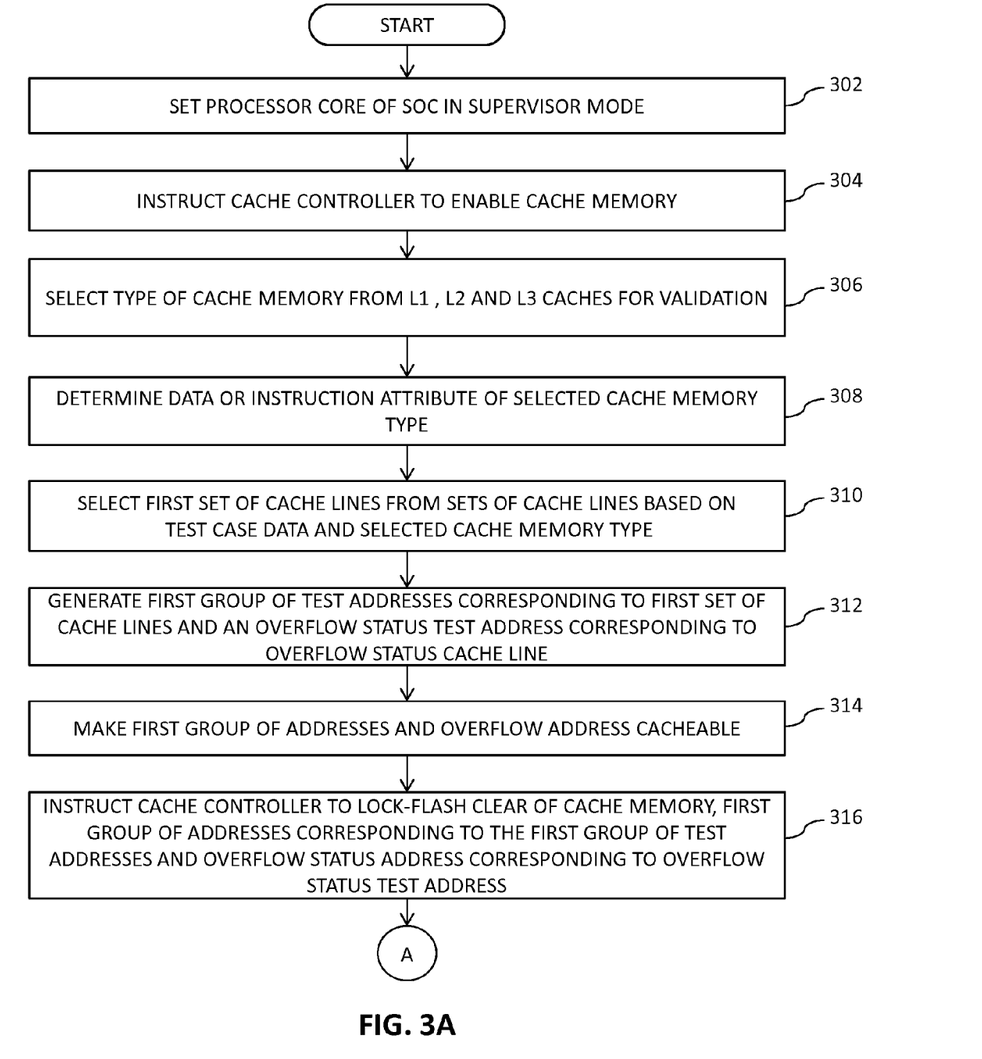
FIGS. 3A and 3B are a flow chart illustrating a method for validating locking and unlocking features of a cache memory in accordance with an embodiment of the present invention.
Figure 3B:
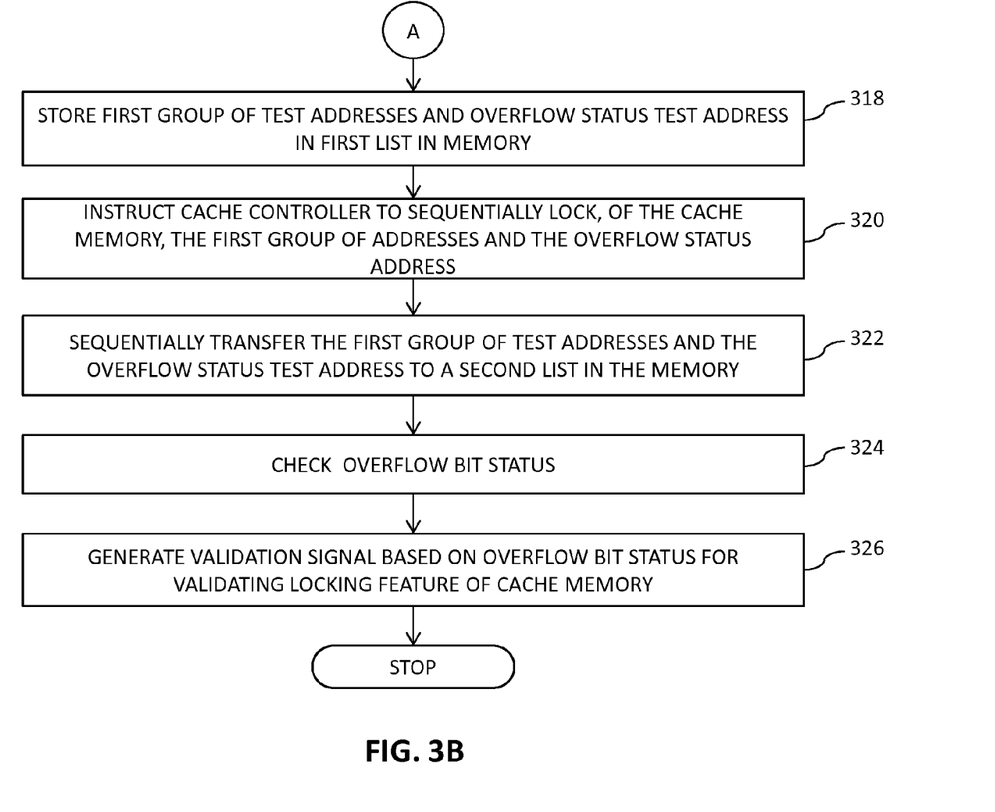

Referring now to FIGS. 3A and 3B, a flow chart illustrating a method for validating the locking and unlocking features of the cache memory 203, in accordance with an embodiment of the present invention, is shown. At step 302, the processor 208 sets the processor core 224 into a supervisor mode for validation. At step 304, the processor 208 instructs the cache controller 226 to enable the cache memory 203. At step 306, the processor 208 instructs the cache controller 226 to determine a type of the cache memory 203 from L1, L2, and L3 caches for validation. At step 308, the processor 208 instructs the cache controller 226 to determine a data or instruction attribute of the selected cache memory 203. At step 310, the processor 208 selects the first set of cache lines of the plurality of sets of cache lines. The first set of cache lines is selected based on the test case data corresponding to the cache memory 203 architecture and the selected type of cache memory 203. At step 312, the processor 208 generates a first group of test addresses corresponding to the first set of cache lines and an overflow status test address corresponding to an overflow status cache line. At step 314, the processor 208 sets an access attribute of the first group of test addresses and the overflow status test address as 'cacheable'.

At step 316, the processor 208 instructs the cache controller 226 to lock-flash clear the first group of addresses and the overflow status address by simultaneously unlocking them. The first group of addresses corresponds to the first group of test addresses and the overflow status address corresponds to the overflow status test address. At step 318, the processor 206 saves the first group of test addresses and the overflow status test address in to the first list in the memory 206. At step 320, the processor 208 instructs the cache controller 226 to sequentially lock the first group of addresses and the overflow status address. At step 322, the processor 208 sequentially transfers the first group of test addresses and the overflow status test address in to the second list located in the memory 206. At step 324, the processor 208 checks the status of the overflow bit in the status register of the cache controller 226, when the first list is empty. At step 326, the processor 208 generates a validation signal based on the status of the overflow bit. The validation signal includes a PASS status signal when the overflow bit is set and a FAIL status signal when the overflow bit is reset.

Figure 4A:
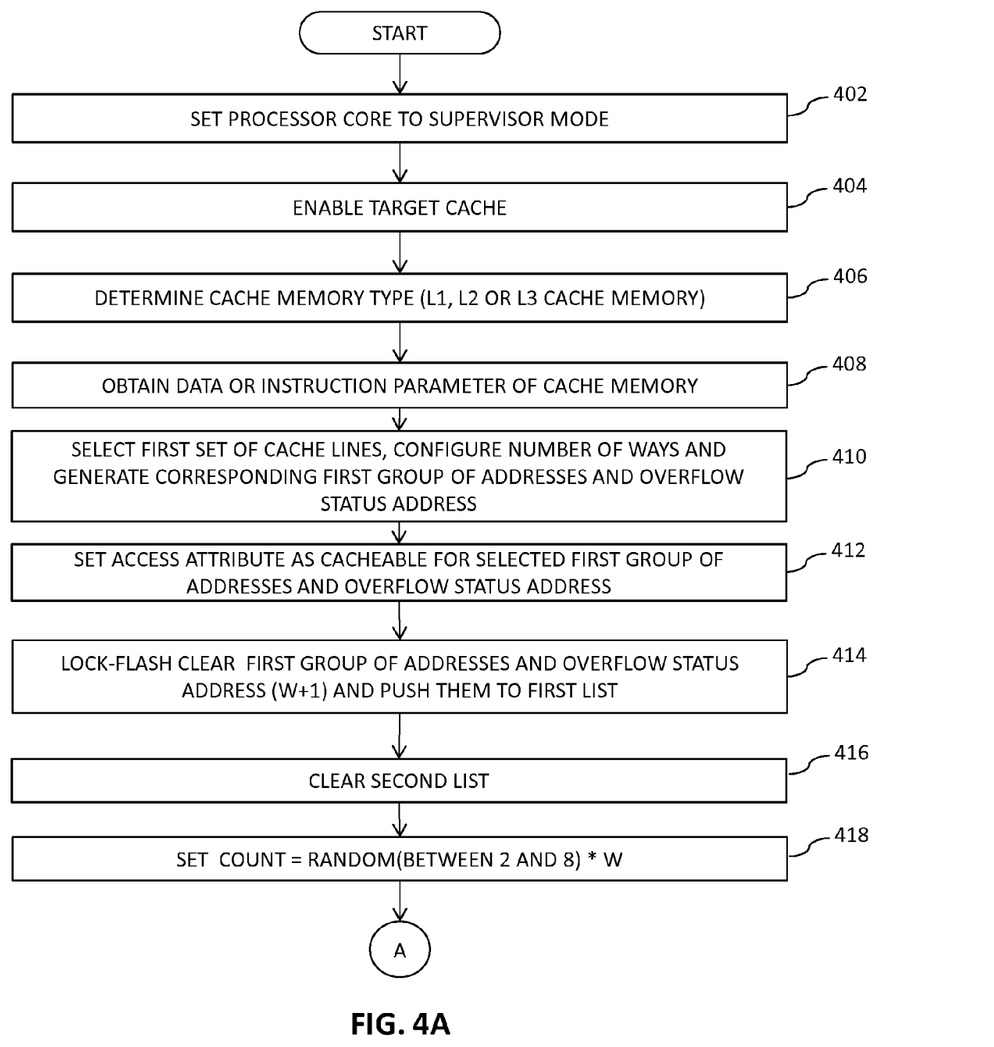
FIGS. 4A and 4B are a flow chart illustrating an exemplary method for validating locking and unlocking features of a cache memory in accordance with an embodiment of the present invention.
Figure 4B:
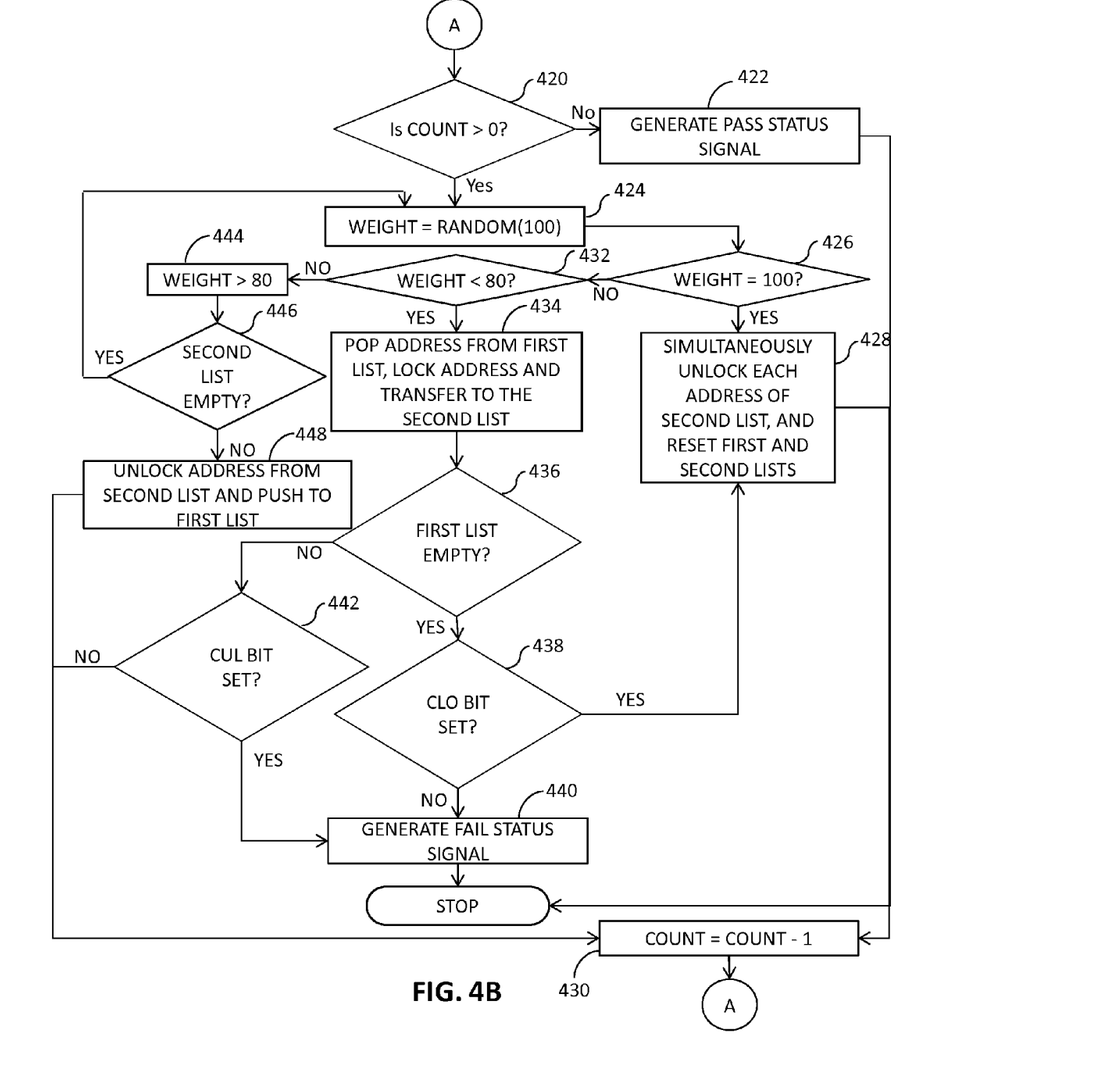

An exemplary method for validating the locking and unlocking features of the cache memory 203 has been illustrated in FIGS. 4A and 4B, in accordance with an embodiment of the present invention. At step 402, the processor 208 sets the processor core 224 in to a supervisor mode of operation for the validation. At step 404, the processor 208 instructs the cache controller 226 to enable the cache memory 203. At step 406, the processor 208 instructs the cache controller 226 to determine a type of the cache memory 203 and the cache controller 226 determines it to be of type L1 cache. At step 408, the processor 208 instructs the cache controller 226 to determine a data or instruction attribute of the selected type of cache memory 203 and the cache controller 226 determines it to be a data cache. At step 410, the processor 208 selects the first set of cache lines, configures a number of ways (W) of the first set of cache lines as eight, based on the selected type of cache memory 203 and the cache memory 203 architecture and generates corresponding first group of addresses and overflow status address. The first group of addresses corresponds to the first group of test addresses and the first overflow status address corresponds to the overflow status test address.

At step 412, the processor 208 instructs the cache controller 226 to make an access attribute of the first group of addresses and the overflow status address as 'cacheable'. At step 414, the processor 208 instructs the cache controller 226 to lock-flash clear the first group of addresses and the overflow status address (W+1) and save the corresponding unlocked first group of test addresses and the unlocked overflow status address into the first list. At step 416, the processor creates the second list in the memory 206. At step 418, the processor 206 sets a variable COUNT equal to eight times (total number of ways) a random number that lies between one to ten. At step 420, a check is performed to determine if COUNT is greater than zero. If at step 420, it is determined that COUNT is not greater than zero, step 422 is executed. At step 422, the processor 208 generates the PASS status signal indicating proper functioning of the locking and unlocking features of the selected type of cache memory 203. However, if at step 420 it is determined that COUNT is greater than zero, step 424 is executed.

At step 424, the processor 208 sets a variable Weight equal to a random number that lies between 1 and 100. At step 426, a check is performed to determine if Weight equals 100. If at step 426 it is determined that Weight equals 100, step 428 is executed. At step 428, the processor 208 instructs the cache controller 226 to lock-flash clear the first group of addresses and the overflow status address and save the corresponding unlocked first group of test addresses and the unlocked overflow status test address into the first list. At step 430, the processor decrements COUNT by one. However, if at step 426 it is determined that Weight does not equal 100, at step 432, a check is performed to determine if Weight is less than 80. If Weight is less than 80, at step 434, the processor 208 instructs the cache controller 226 to lock an address of the first group of addresses. The processor 208 simultaneously transfers corresponding test address of the first group of test addresses to the second list.

At step 436, a check is performed to determine if the first list is empty. If the first list is empty, at step 438, a check is performed to determine if the overflow bit is set. If the overflow bit is set, step 428 is executed. However, if the overflow bit is not set, step 440 is executed. At step 440, the processor 208 generates the FAIL status signal indicating improper functioning of the locking feature of the selected type of cache memory 203. However, if the first list is not empty, at step 442, a check is performed to determine if the CUL bit is set. If the CUL bit is set, step 440 is executed. However, if the CUL bit is not set, step 430 is executed.

However, if at step 432 it is determined that Weight is not less than 80 and not equal to 100, at step 446, a check is performed to determine if the second list is empty. If the second list is empty, step 424 is executed. However if the second list not empty, at step 448, the processor 208 instructs the cache controller 226 to unlock a locked address that corresponds to a locked test address in the second list. The processor 208 simultaneously transfers the unlocked test address to the first list. After step 448, step 430 is performed. The validation of the locking, unlocking, and lock-flash clear feature of the cache memory 203 continues till COUNT equals zero.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An apparatus for validating a locking feature of a cache memory coupled to a cache controller, wherein the cache memory includes a plurality of sets of cache lines, the apparatus comprising:
   a memory that includes a test case generator that stores test case data corresponding to an architecture of the cache memory; and
   a processor in communication with the memory, wherein the processor includes:
      means for selecting a first set of cache lines of the plurality of sets of cache lines based on the test case data;
      means for generating a first group of test addresses corresponding to the first set of cache lines and an overflow status test address corresponding to an overflow status cache line;
      means for instructing the cache controller to simultaneously unlock a first group of cache memory addresses corresponding to the first group of test addresses and an overflow status address corresponding to the overflow status test address;
      means for saving the first group of test addresses and the overflow status test address in a first list;
      means for instructing the cache controller to sequentially lock the first group of cache memory addresses and the overflow status address, and wherein the cache controller sets an overflow bit in a status register thereof upon locking the overflow status address;
      means for transferring the first group of test addresses and the overflow status test address to a second list, in a sequential manner; and
      means for generating a validation signal based on a status of the overflow bit for validating the cache memory locking feature.

2. The apparatus of claim 1, wherein the cache memory and the cache controller are part of a System-on-Chip (SOC), and the processor further includes means for setting a core of the SOC in a supervisor mode of operation for validating the cache memory locking feature.

3. The apparatus of claim 1, wherein the processor further includes means for instructing the cache controller to enable the cache memory before validating the locking feature.

4. The apparatus of claim 1, wherein the processor further comprises means for instructing the cache controller to select at least one of an L1 cache, an L2 cache and an L3 cache for validation and identify at least one of a data and an instruction attribute of the selected cache.

5. The apparatus of claim 1, wherein the processor further comprises means for identifying access attributes corresponding to the first group of test addresses and the overflow status test address to be cacheable.

6. The apparatus of claim 1, wherein the means for selecting randomly selects the first set of cache lines, which includes a predefined number of cache lines and validates the locking feature a random number of times that is a function of the predefined number of cache lines.

7. The apparatus of claim 1, wherein the validation signal includes a PASS status signal when the overflow bit is set and a FAIL status signal when the overflow bit is reset.

8. The apparatus of claim 1, wherein the processor comprises means for validating an unlocking feature of the cache memory by instructing the cache controller to unlock a locked address corresponding to a locked test address in the second list when the second list contains at least one test address, and transfers the unlocked test address to the first list.

9. The apparatus of claim 1, wherein the processor comprises means for validating a lock-flash clear feature of the cache memory by instructing the cache controller to simultaneously unlock the first group of addresses of the cache memory corresponding to the first group of test addresses.

10. The apparatus of claim 1, wherein the processor further comprises means for instructing the cache controller to clear a cache-unable-to-lock (CUL) bit in the status register before validating the locking feature, and wherein the processor generates a FAIL status signal when the CUL bit is set during validation of the locking feature.

11. A method for validating at least one feature of a cache memory of a system-on-chip (SoC) using a validation apparatus that includes a memory that stores test case data corresponding to an architecture of the cache memory and a processor in communication with the memory, wherein the SoC includes a cache controller in communication with the cache memory, and wherein the cache memory includes a plurality of sets of cache lines, the method comprising:
- selecting a first set of the plurality of sets of cache lines based on the test case data;
- generating a first group of test addresses corresponding to the first set of cache lines and an overflow status test address corresponding to an overflow status cache line;
- instructing the cache controller to simultaneously unlock, a first group of addresses of the cache memory corresponding to the first group of test addresses and an overflow status address corresponding to the overflow status test address;
- saving the first group of test addresses and the overflow status test address to a first list;
- instructing the cache controller to sequentially lock the first group of addresses of the cache memory and the overflow status address, wherein the cache controller sets an overflow bit in a status register thereof upon locking the overflow status address;
- transferring sequentially the first group of test addresses and the overflow status test address to a second list; and
- generating a validation signal based on a status of the overflow bit for validating a locking feature of the cache memory.

12. The method of claim 11, further comprising setting a core of the SoC in a supervisor mode of operation for validating the locking feature.

13. The method of claim 11, further comprising instructing the cache controller to enable the cache memory before validating the locking feature.

14. The method of claim 11, further comprising instructing the cache controller to select at least one of an L1, L2 and L3 cache for validation and identify at least one of a data and an instruction attribute of the selected cache.

15. The method of claim 11, wherein the first and second lists are stored in the memory.

16. The method of claim 11, further comprising randomly selecting the first set of cache lines that includes a predefined number of cache lines and validating the locking feature for a random number of times that is a function of the predefined number of cache lines.

17. The method of claim 11, wherein the validation signal includes a PASS status signal when the overflow bit is set and a FAIL status signal when the overflow bit is reset.

18. The method of claim 11, further comprising validating an unlocking feature of the cache memory by instructing the cache controller to unlock a locked address corresponding to a locked test address in the second list when the second list contains at least one test address, and transferring the unlocked test address to the first list.

19. The method of claim 11, further comprising validating a lock-flash clear feature of the cache memory by instructing the cache controller to simultaneously unlock the first group of addresses corresponding to the first group of test addresses.

20. The method of claim 11, further comprising instructing the cache controller to clear a cache-unable-to-lock (CUL) bit in the status register of the cache controller before validating the locking feature and generating a FAIL status signal when the CUL bit is set during validation of the locking feature.

* * * * *